US007004715B2

(12) United States Patent
Friedman et al.

(10) Patent No.: US 7,004,715 B2
(45) Date of Patent: Feb. 28, 2006

(54) APPARATUS FOR TRANSFERRING AND LOADING A RETICLE WITH A ROBOTIC RETICLE END-EFFECTOR

(75) Inventors: Glenn M. Friedman, Redding, CT (US); Peter Kochersperger, Easton, CT (US); Joseph Laganza, East Norwalk, CT (US)

(73) Assignee: ASML Holding N.V., Veldhoven (NL)

( * ) Notice: Subject to any disclaimer, the term of this patent is extended or adjusted under 35 U.S.C. 154(b) by 39 days.

(21) Appl. No.: 10/040,375

(22) Filed: Jan. 9, 2002

(65) Prior Publication Data

US 2003/0129051 A1   Jul. 10, 2003

(51) Int. Cl.
   *B66C 1/00*   (2006.01)
(52) U.S. Cl. .......................... 414/737; 294/1.1; 901/30
(58) Field of Classification Search ................. 294/1.1; 901/30; 414/737, 752, 941, 935
   See application file for complete search history.

(56) References Cited

U.S. PATENT DOCUMENTS

| 4,984,953 | A | | 1/1991 | Nakazato et al. | |
|---|---|---|---|---|---|
| 5,130,747 | A | | 7/1992 | Kikuiri et al. | |
| 5,636,964 | A | * | 6/1997 | Somekh et al. | 414/941 |
| 5,980,187 | A | | 11/1999 | Verhovsky | |
| 6,499,777 | B1 | * | 12/2002 | Wang | 294/1.1 |
| 2001/0035942 | A1 | | 11/2001 | Hara et al. | |
| 2002/0002946 | A1 | | 1/2002 | Tanaka et al. | |
| 2002/0020751 | A1 | | 2/2002 | Matsumoto | |

FOREIGN PATENT DOCUMENTS

| EP | 0 452 041 A1 | 10/1991 |
|---|---|---|
| WO | WO 03/013993 A1 | 2/2003 |

OTHER PUBLICATIONS

English-language Abstract of JP 11-074182, published Mar. 16, 1999, from http://www1.jpdl.jpo.go.jp, 9 Pages (last visited Nov. 13, 2003).
Copy of Australian Search Report for Appln. No. SG 200300053-6, mailed Nov. 20, 2003, 4 pages.
Copy of Singapore Search Report and Written Opinion for Appln. No. 200300053-6, mailed November 29, 2004, 5 pages.

* cited by examiner

*Primary Examiner*—Donald W. Underwood
(74) *Attorney, Agent, or Firm*—Sterne, Kessler, Goldstein & Fox P.L.L.C.

(57) ABSTRACT

An apparatus and method of transferring and loading a reticle onto a receiving station (for example, a reticle exposure stage). The reticle is first retrieved from a storage facility with an end effector having an reticle plate coupled to a mounting plate. The mounting plate connects the end effector to a robotic arm. The reticle is aligned in an out-of-plane position in an off-line alignment station. The alignment is in compliance with the alignment requirement at the receiving station. The reticle is mounted onto the reticle plate after undergoing the alignment at the off-line alignment station. The reticle is then transferred from the off-line alignment station to the receiving station while maintaining the previous alignment at the off-line alignment station. The apparatus further provides rigidity of the mounted reticle to ensure compliance with the alignment requirement at the receiving station.

19 Claims, 8 Drawing Sheets

APPARATUS FOR TRANSFERRING AND LOADING A RETICLE WITH A ROBOTIC RETICLE END-EFFECTOR

BACKGROUND OF THE INVENTION

1. Field of the Invention

The present invention relates generally to lithography systems. More particularly, the present invention relates to transferring and loading a reticle onto a receiving station while maintaining out-of-plane reticle alignment and providing rigidity of the reticle during the transfer.

2. Background Art

Lithography is a process used to create features on the surface of substrates. Such substrates can include those used in the manufacture of flat panel displays, circuit boards, various integrated circuits, and the like. A frequently used substrate for such applications is a semiconductor wafer. One skilled in the pertinent art would recognize that the description herein would also apply to other types of substrates known to those skilled in the pertinent art.

During lithography, a wafer, which is disposed on a wafer stage, is exposed to an image projected onto the surface of the wafer by an exposure system located within a lithography system. The exposure system includes a reticle (also called a mask) for projecting the image onto the wafer.

The reticle is generally located between a semiconductor chip and a light source. In photolithography, the reticle is used as a photo mask for printing a circuit on a semiconductor chip, for example. The reticle, typically made of glass, requires delicate handling because it can easily be flawed by minute scratches or contamination.

A loading process is required for loading the reticle onto a reticle exposure stage. The reticle must be very precisely aligned at a predetermined position. Any error in the alignment must be within a correctable range of compliance. Accordingly, the distance between the reticle and the reticle exposure stage during the loading process must be minimized. The position of a reticle can be adjusted by rotating and moving the reticle in the X-Y plane direction. However, in minimizing this distance, careful attention must be paid to avoid flawing the reticle by bumping it against the stage.

Conventionally, an alignment mark formed in the reticle is used to align the reticle by locating the alignment mark. A reference mark in the reticle exposure stage is positioned under a reticle alignment microscope to assist in the alignment process. By detecting the alignment mark of the reticle through the microscope, pre-alignment and post-alignment operations are performed. To decrease reticle exchange time and thereby increase throughput of the lithography system, alignment of the reticle at an off-line alignment station is desirable.

Conventionally, "pushers" were used to pre-align the reticle in the off-line alignment station. Use of the pushers, however, resulted in non-compliance of the alignment of the reticle at the off-line alignment station with the required alignment of the reticle, which subsequently occurred at the reticle exposure stage. As a result, the throughput of the lithography system was still not increased.

The means of reticle transfer that could maintain compliant off-plane and remain rigid in-plane were not available prior to the present invention. In other words, prior to the present invention, the out-of-plane pre-alignment position alignment of the reticle at the off-line alignment station could not be maintained to the precision that is required to achieve the desired performance at the reticle exposure stage.

Therefore, what is needed is a method and apparatus of transferring and loading a pre-aligned reticle onto a reticle exposure stage without losing pre-alignment of the reticle.

BRIEF SUMMARY OF THE INVENTION

The present invention is an apparatus and method of transferring and loading a reticle onto a receiving station (for example, a reticle exposure stage). More specifically, the present invention is an apparatus and method for providing out-of-plane pre-alignment compliance with the alignment of the reticle at the reticle exposure stage, while maintaining in-plane rigidity of the reticle during transport to the alignment stage. The reticle is first retrieved from a storage facility with an end effector having an attachment device coupled to a mounting plate. The reticle can be secured to the attachment device with a variety of methods. In one configuration, the reticle is secured to the reticle plate by a vaccuming function. In another configuration, the reticle can be secured to the attachment device by a solenoid driven clamp. In yet another configuration, the reticle can be secured to the attachment device by an electrostatic charge. The mounting plate connects the end effector to a robotic arm. After the reticle is pre-aligned in an out-of-plane position in an off-line alignment station, it is mounted on the attachment device. A locking device can be located between the attachment device and the mounting plate. The locking device allows the attachment device to lock against the mounting plate in an in-plane position to prevent the secured reticle from being disturbed. The reticle is then transferred from the off-line alignment station to the reticle exposure stage while maintaining the previous pre-alignment done at the off-line alignment station. The apparatus further provides rigidity of the mounted reticle to ensure compliance with final alignment of the reticle at the reticle exposure stage.

BRIEF DESCRIPTION OF THE DRAWINGS/FIGURES

The accompanying drawings, which are incorporated herein and form part of the specification, illustrate the present invention and together with the description further serve to explain the principles of the invention and to enable a person skilled in the pertinent art to make and use the invention.

DETAILED DESCRIPTION OF THE INVENTION

An example embodiment of the present invention is now described with reference to the figures where like reference numbers indicate identical or functionally similar elements. The left most digit of each reference number corresponds to the figure in which the reference number is first used. While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Figure 1:
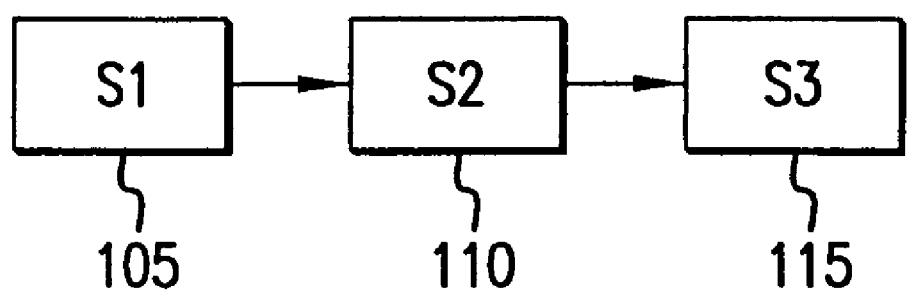
FIG. 1 is a block diagram of the stages of reticle processing.

FIG. 1 illustrates typical stages involved in the processing of a reticle. In the first stage 105, the reticle is retrieved from a reticle cassette (that is, a reticle storage facility) by an end effector. In the second stage 110, the reticle is transferred to the off-line alignment station and pre-aligned prior to transferral to the reticle exposure stage. An off-line alignment station is a station located away from the reticle exposure stage, at which the reticle undergoes pre-alignment before being aligned at the reticle exposure stage. Reticle pre-alignment is desired, as it can increase throughput of a lithography system in which the present invention is utilized. In the third stage 115, the reticle undergoes final alignment prior to projecting an image onto a wafer. The final alignment is necessary to precisely align the reticle with the reticle exposure stage in order to perfect the projection of the image onto the wafer.

Figure 2:
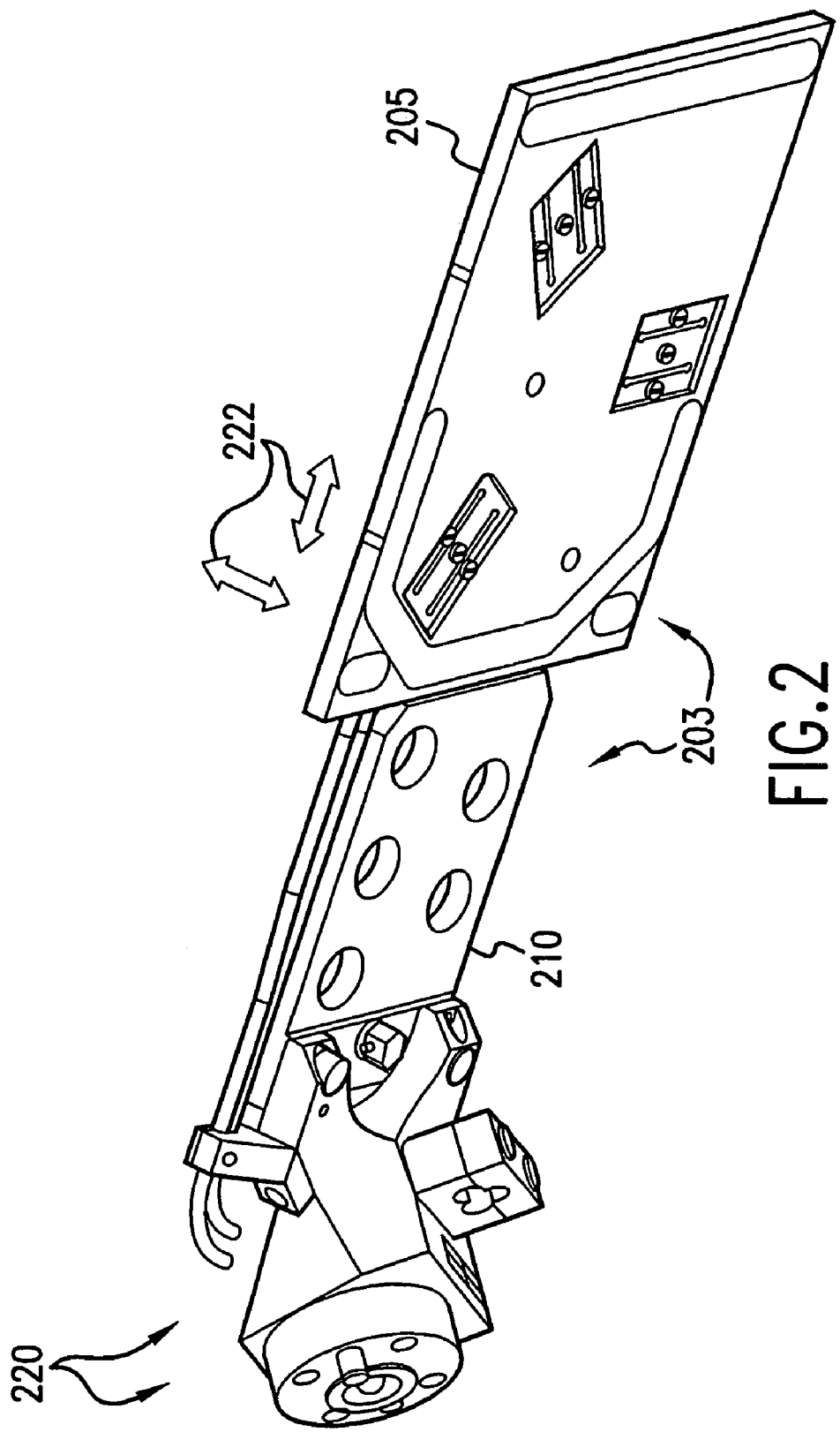
FIG. 2 is an illustration of a frontal perspective view of an end effector coupled to a robotic connector according to an embodiment of the present invention.

FIG. 2 is a perspective view, illustrating a frontal perspective view of an end effector coupled to a robotic connector according to an embodiment of the present invention.

End effector 203 comprises reticle plate 205 and mounting plate 210.

The reticle plate 205 is coupled to an end of the mounting plate 210. The reticle plate 205 can be coupled to the mounting plate 210 by any method known to one skilled in the pertinent art. For example, in one embodiment, the reticle plate 205 is coupled to the mounting plate 210 by screws.

The end effector 203 is coupled to the robotic connector 220. The robotic connector 220 is coupled to a robotic arm (not shown). Through movement of the robotic arm, the end effector 203 is capable of movement in at least a vertical direction and a horizontal direction, as shown generally by arrows 222 in FIG. 2.

The end effector 203 retrieves a reticle (not shown) from a cassette (not shown) and mounts the reticle on the reticle plate 205. The end effector 203 then places the reticle on the off-line alignment station (not shown) for prealignment. After pre-aligning the reticle at the off-line alignment station, the end effector 203 retrieves the reticle from the off-line alignment station and transfers the pre-aligned reticle to the reticle exposure stage, for example.

The reticle plate 205 holds the reticle to be aligned at the reticle exposure stage after it is retrieved from the off-line alignment station. The reticle plate 205 is capable of moving in an in-plane/out-of-plane motion. This motion is very slight and best described as an in and out motion with respect to the mounting plate 210. In an "in" motion, the reticle plate 205 is closest to the mounting plate 210. In an "out" motion, the reticle plate is farthest from the mounting plate 210. The reticle is pre-aligned in the out-of-plane position at the off-line alignment station in preparation for image projection at the reticle exposure stage.

The reticle can be secured to the reticle plate 205 by a variety of methods. For example, in one particular configuration of the present invention, the reticle is secured to the reticle plate by a vacuuming function. In the vacuuming method, the reticle plate is known as a vacuum plate. Alternatively, the reticle can be secured to the reticle plate 205 by at least one solenoid driven clamp. In this method, the reticle plate 205 is known as a clamping plate. Instead of securing the reticle to the reticle plate 205 by a solenoid driven clamp, the reticle can be secured to the reticle plate 205 by means of an electrostatic charge placed on the reticle plate, which is known as an electrostatic plate in this configuration. The present invention, however, is not limited to such methods of securing the reticle to the reticle plate. It should be noted that other methods of securing the reticle to the reticle plate 205 could be used without departing from the spirit and scope of the present invention.

Figure 3:
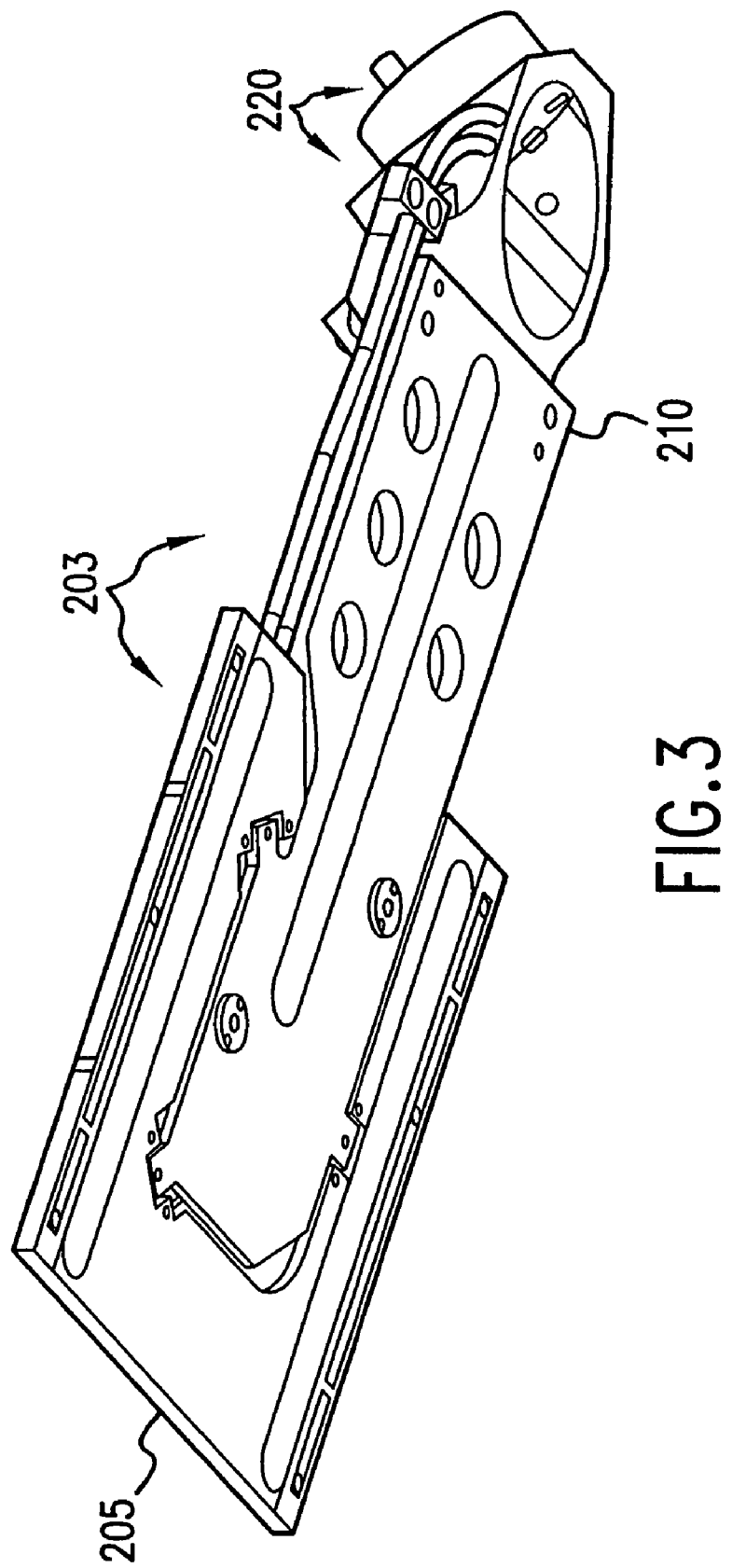
FIG. 3 is an illustration of a rear perspective view of an end effector coupled to a robotic connector according to an embodiment of the present invention.

FIG. 3 illustrates a rear perspective view of the end effector 203 coupled to the robotic connector 220. End effector 203 comprises the reticle plate 205 and the mounting plate 210, as described in FIG. 2.

Figure 4:
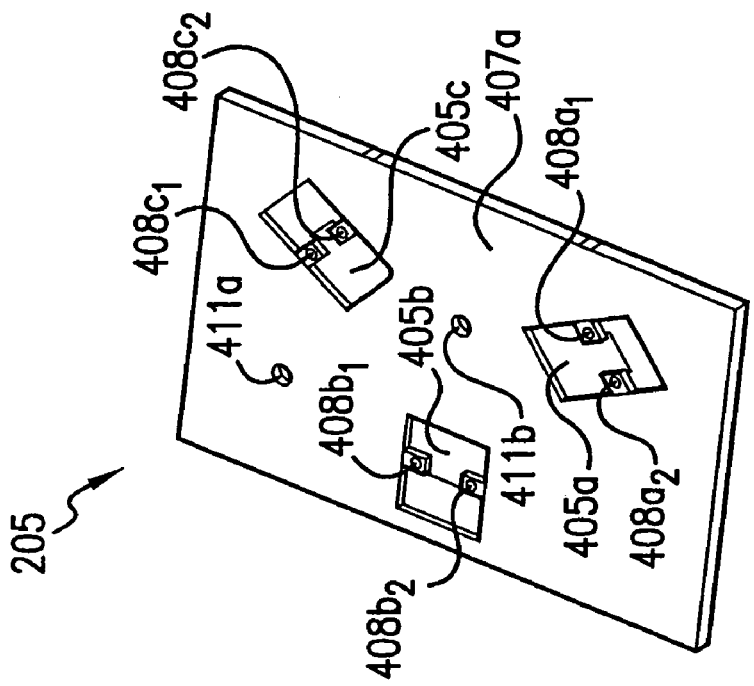
FIG. 4 is an illustration of a reticle plate with its associated features according to an embodiment of the present invention.
Figure 4:
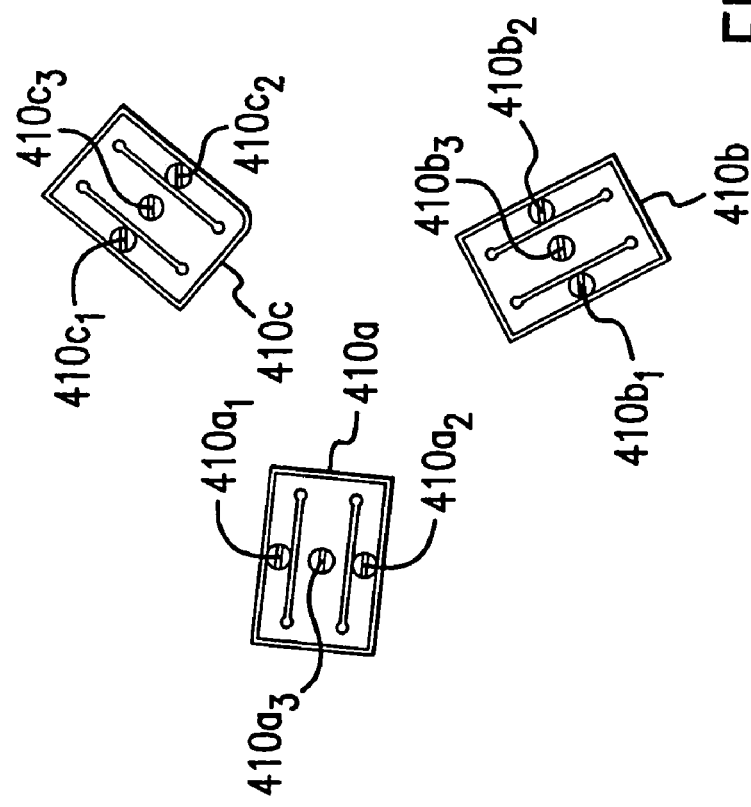

FIG. 4 is an exploded view that illustrates the reticle plate 205 with its associated features according to the present invention. The reticle plate 205 has a first side 407a facing the reticle (not shown). The reticle plate 205 also has a second side (not shown) opposite of the first side 407a. The reticle plate 205 holds the reticle after it is retrieved from the cassette.

The reticle plate 205 is comprised of an aluminum hardcoat surface in one configuration of the present invention. The aluminum hardcoat surface allows the reticle plate 205 to be more contamination resistant. One skilled in the pertinent art, however, would recognize that the reticle plate 205 could be any other suitable material for desired performance.

The reticle plate 205 comprises openings 405a–c, and indentations $408a_{1\text{-}2}$–$c_{1\text{-}2}$. Alternatively, the present invention can comprise only one of the openings 405a–c. Likewise, the present invention can comprise only one of the indentations $408a_{1\text{-}2}$–$c_{1\text{-}2}$. Flexures 410a–c, screws $410a_{1\text{-}3}$–$c_{1\text{-}3}$, and travel stops 411a–b are also present on the reticle plate 205. In an alternative configuration, the present invention can comprise only one of the flexures 410a–c, one of the screws $410a_{1\text{-}3}$–$c_{1\text{-}3}$, and/or one of the travel stops 411a–b.

The indentations $408a_{1\text{-}2}$–$c_{1\text{-}2}$ allow the flexures 410a–c to mount to the first side 407a of the reticle plate 205.

Each of the flexures 410a–c is arranged in a triangular geometry across the first side 407a of the reticle plate 205, such that each one of the flexures 410a–c forms a vertex of the triangle. Further, each of the flexures 410a–c fits in one of the openings 405a–c and couples to at least one of the indentations $408a_{1\text{-}2}$–$c_{1\text{-}2}$ in each of the openings 405a–c. For example, the flexure 410a fits in the opening 405a and is coupled to the indentation $408a_1$ by screw $410a_1$. The flexure 410a is also coupled to the indentation $408a_2$ by screw $410a_2$. Likewise, the flexure 410b fits in the opening 405b and is coupled to the indentation $408b_1$ by screw $410b_1$. The flexure 410b is also coupled to the indentation $408b_2$ by screw $410b_2$. The flexure 410c fits in the opening 405c and is coupled to the indentation $408c_1$ by screw $410c_1$. The flexure $410c$ is also coupled to the indentation $408c_2$ by screw $410c_2$.

The screws $410a_3$–$c_3$ extend through the flexures $410a$–$c$ and couple the reticle plate 205 to the mounting plate, as will be described in FIG. 6.

The flexures 410 allow slight "in and out" movement of the reticle plate 205 from the mounting plate 210. In others words, the flexures 410 allow the "in and out" distance from the reticle plate 205 and the mounting plate 210 to be varied.

The flexures $410a$–$c$ can be U-shaped leaf spring mechanisms with a slight preload. During loading and pre-alignment of the reticle at the off-line alignment station, the reticle is gently pressed against the reticle plate 205, thereby overcoming the preload of the flexures $410a$–$c$ to lift the reticle off of the resting mechanism on the off-line alignment station. As the preload is overcome, the reticle is secured to the reticle plate, thereby precisely pre-aligning the reticle in the out-of-plane position in preparation for the final alignment at the reticle exposure stage. It should be noted that this precise out-of-plane pre-alignment is in compliance with alignment requirements at the reticle exposure stage.

The flexures $410a$–$c$ can be comprised of stainless steel. One skilled in the pertinent art, however, would recognize that the flexures $410a$–$c$ could be comprised of other material suitable for performance of the flexures.

Travel stops $411a$–$b$ can be screws or any other type of fasteners known to those skilled in the pertinent art. The travel stops $411a$–$b$ extend through the first side $307a$ of the reticle plate 205 and connect to the mounting plate 210 (shown in FIG. 2), thereby restricting out-of-plane motion of the reticle plate 210. Alternatively, the travel stops $411a$–$b$ can extend through the mounting plate 205 and mount to the second side (not shown) of the reticle plate.

The travel stops $411a$–$b$ restrict the in-and-out motion of the reticle plate 205. The travel stops $411a$–$b$ serve as reinforcement mechanisms for the flexures $410a$–$c$ by preventing the flexures 410 from straining or bending. Such straining or bending of the flexures $410a$–$c$ is undesirable as it would greatly disturb precise pre-alignment of the reticle at the off-line alignment station.

The travel stops $411a$–$b$ can be comprised of stainless steel. One skilled in the pertinent art, however, would recognize that the travel stops $411a$–$b$ can be comprised of any other material suitable for the performance of the travel stops $411a$–$b$.

Figure 5:
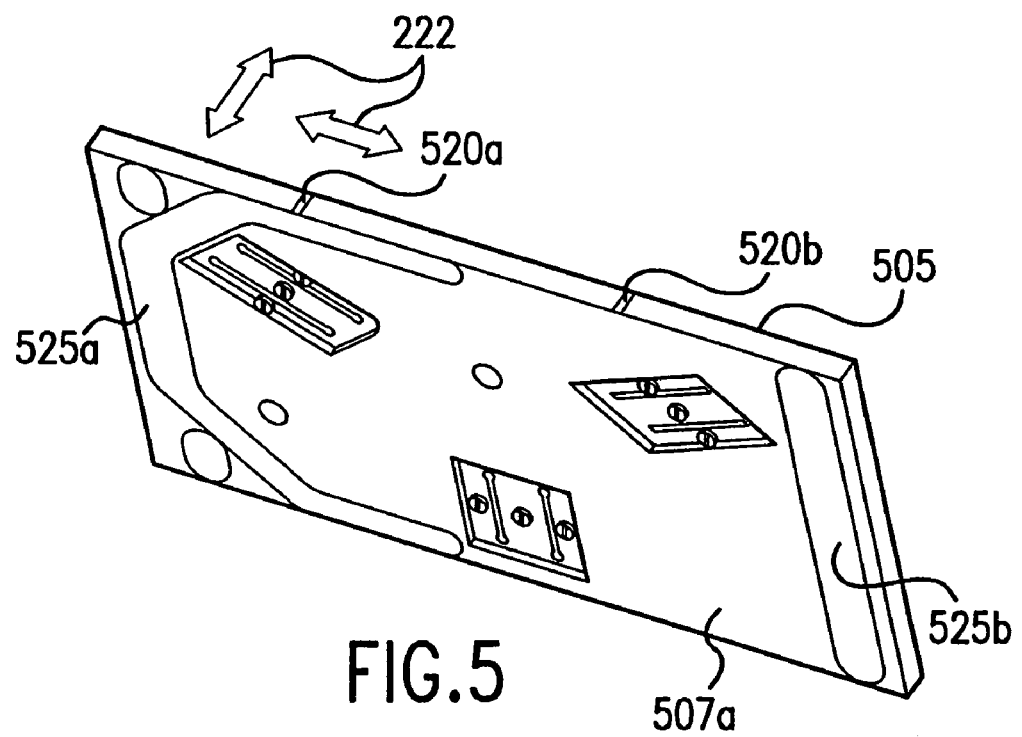
FIG. 5 is an illustration of a vacuum plate and its associated features according to an embodiment of the present invention.

FIG. 5 is a perspective view, illustrating the particular configuration of the present invention in which the reticle is secured to the vacuum plate by a vacuuming function.

In the configuration of the present invention depicted in FIG. 5, the reticle plate is known as a vacuum plate. The vacuum plate 505 holds the reticle after it is retrieved from the reticle cassette, for example.

In addition to the associated features of the reticle plate described in FIG. 4, the configuration of FIG. 5 (the configuration of the present invention in which the reticle is secured to the vacuum plate by the vacuuming function), utilizes the additional elements of vacuum lands $520a$–$b$ and seals $525a$–$b$. Just as the reticle plate 205 has a first side and a second side, the vacuum plate has a first side $507a$ and a second side (not shown) opposite the first side $507a$.

The vacuum lands $520a$–$b$ are located along edges on the vacuum plate 505. One skilled in the pertinent art would recognize that other configurations of the location of the vacuum lands 520 can be varied without departing from the spirit and scope of the present invention. For example, in another configuration, the vacuum lands $520a$–$b$ are dispersed along corners of the vacuum plate 505.

In one configuration, the vacuum lands $520a$–$b$ are comprised of at least one primary vacuum land $520a$ and at least one secondary vacuum land $520b$. In this alternative configuration, the redundancy of the vacuum lands is designed for safety during a reticle transfer motion to prevent collision or slipping of the reticle.

In one configuration, the vacuum lands $520a$–$b$ can be plastic ducts. The vacuum lands $520a$–$b$ provide a vacuuming function for holding the reticle to the vacuum plate 505 during reticle transfer (for example, the vacuum lands can be plastic ducts in one configuration of the present invention). Such a vacuuming function is well known to one skilled in the pertinent art and will not be further described herein. In one configuration, the vacuum lands $520a$–$b$ are supplied by independent vacuum sources (that is, each vacuum land is supplied by a different vacuum source). In yet another configuration, the vacuum lands 520 are supplied by the same vacuum source.

If the reticle slips or is otherwise disturbed while mounted on the vacuum plate 505, a vacuum lost occurs at the secondary vacuum land(s) $520b$. During the vacuum loss, the primary vacuum land, however, continues to perform its vacuuming function to prevent the reticle from being disturbed while mounted on the vacuum plate 505. The robot is then signaled to stop the motion of its arm, thereby stopping the motion of the mounting plate (shown in FIG. 2), which transports the reticle. For example, the robot could be signaled to stop the motion of its arm by the incorporation of a robotic sensor (not shown), which would notify the robot of the vacuum loss. After the motion of the robotic arm is stopped, the vacuum loss could be remedied by re-securing the reticle to the vacuum plate.

Seals $525a$–$b$ are located along the borders on the first side $507a$ of the vacuum plate 505. One skilled in the pertinent art, however, would recognize that the seals $525a$–$b$ could be located in other places on the vacuum plate 505 without departing from the spirit and scope of the present invention. For example, in one embodiment of the present invention, the seals $525a$–$b$ are located in the center of the vacuum plate 505. In yet another embodiment, the seals $525a$–$b$ are located on the borders of the vacuum plate 505 and the center of the vacuum plate 505.

The seals $525a$–$b$ provide a "cushion" for the reticle and allow the reticle to be secured to the vacuum plate 505. Operation of the seals $525a$–$b$ are well known to one skilled in the pertinent art and will not be further described herein.

The seals 525 are comprised of thin stainless steel. One skilled in the pertinent art, however, would recognize that other suitable materials could be used for the seals $525a$–$b$.

Figure 6:
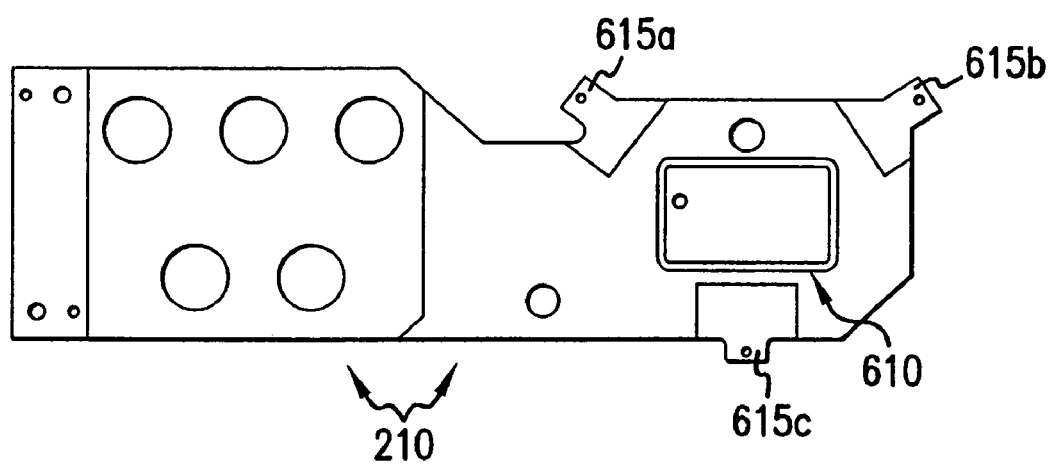
FIG. 6 is an illustration of a mounting plate according to an embodiment of the present invention, which employs a vacuum plate.

FIG. 6 is an illustration of a mounting plate according to an embodiment of the present invention in which the vacuum plate is utilized.

As generally described in FIG. 2, one end of the mounting plate 210 is coupled to the reticle plate 205. The other end of the mounting plate 210 is coupled to the robotic connector 220.

The mounting plate 210 includes vacuum lock 610 and holes $615a$–$c$. The vacuum lock 610 lies on the mounting plate 210 and is located between the mounting plate 210 and the reticle plate 205 (shown in FIG. 2). The vacuum lock 610 forces the reticle plate 205 to remain rigid in its in-plane position against the mounting plate 210.

The above referenced preload of the flexures $410a$–$c$ causes the reticle plate 205 to rest against the mounting plate 210. During robotic arm motion (during movement of the robotic arm after the reticle has been aligned at the off-line alignment station), however, the reticle plate 205 on which the pre-aligned reticle is mounted can vibrate against the mounting plate 210. This vibration is undesirable, as it can cause the above-described precise pre-alignment of the reticle at the off-line alignment station to be disturbed.

To prevent the undesirable vibration of the reticle plate 205 against the mounting plate 210, the vacuum lock 610 forces the reticle plate 205 to remain steady against the mounting plate 210 (in the in-plane position), thereby locking the reticle plate 205 against the mounting plate 210 by a vacuuming function. The vacuum lock 610 can be a pneumatically driven solenoid locking device. Such pneumatically driven solenoid locking devices are well known to those skilled in the pertinent art. The vacuum lock 610 provides in-plane rigidity during transport of the reticle from the off-line alignment station to the reticle exposure stage, thereby preventing the above-described out-of-plane pre-alignment of the reticle from being disturbed while it is in transport to the reticle exposure stage. The vacuum lock 610 ensures the out-of-plane alignment operation at the off-line alignment station will remain in compliance with the required alignment of the reticle at the reticle exposure stage.

After the robotic arm transfers the reticle (via the end-effector 203) to the reticle exposure stage, the vacuum lock 610 unlocks the reticle plate 205 from the mounting plate 210, thereby allowing the reticle plate 205 to slightly move out of the in-plane position. Upon unlocking, the reticle plate 205 moves to the position at which it is farthest from the mounting plate 210 (its out-of-plane position). In other words, when the reticle plate 205 is unlocked, the distance between it and the mounting plate 210 is slightly increased. At this point, the reticle, having already undergone pre-alignment at the off-line alignment station (in compliance with the alignment requirement at the reticle exposure stage), is loaded onto the reticle exposure stage for the exposure operation.

The holes 615a–c allow the reticle plate 205 (shown in FIG. 2) to mount to the mounting plate 210 via the flexures. More specifically, each of the screws $410a_3$–$c_3$ extends through its respective flexure 410 and screws into one of the holes 515a–c, thereby coupling the reticle plate 205 to the mounting plate 210.

The mounting plate 210 is comprised of stainless steel. One skilled in the pertinent art, however, would recognize that the mounting plate 210 could be comprised of any other material suitable for the performance of the mounting plate 210.

Figure 7:
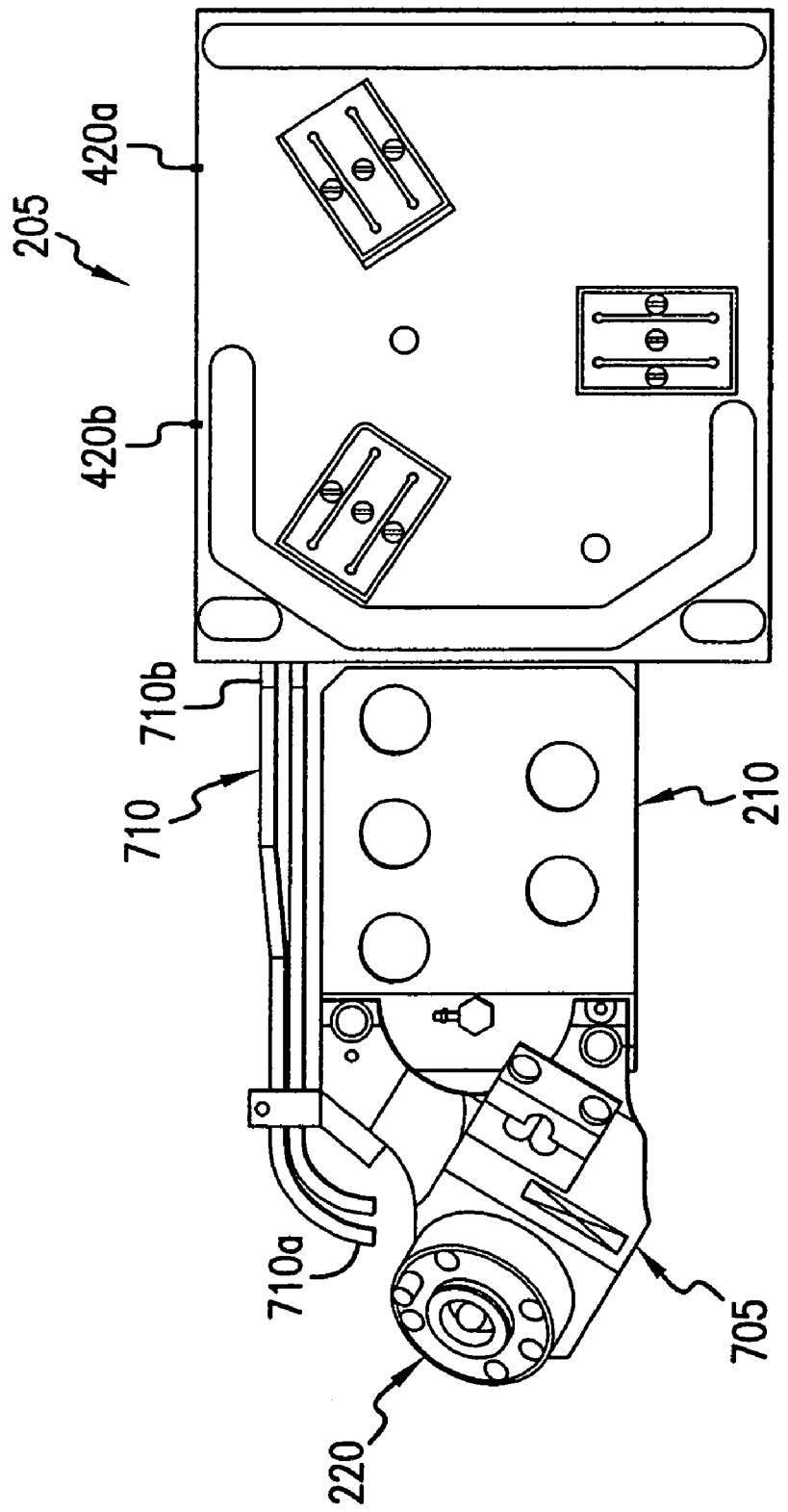
FIG. 7 is an illustration of a robotic connector according to an embodiment of the present invention, which employs a vacuum plate.

FIG. 7 is an illustration of a robotic connector according to the method of the present invention in which the reticle is secured to the vacuum plate by a vacuuming function. Such a robotic connector is well known to those skilled in the pertinent art and will only be described briefly herein. Robotic connector 220 comprises mounting bracket 705 and vacuum source 710.

The robotic connector 220 causes the end-effector 203 to move according to the motion of the robotic arm to which the robotic connector 220 is coupled. This configuration of the mounting bracket 705 enables the mounting plate 210 to rotate at a 30° angle and a 40° angle (i.e., a dual offset). Rotation occurs at the axis of the robot at the two different angles. As would be apparent to one skilled in the pertinent art, however, mounting bracket 705 could execute other angles of rotational freedom without departing from the spirit and scope of the present invention.

The rotational freedom of the mounting bracket 705 does not affect the stability of the reticle while mounted on the reticle plate 205. The stability of the reticle mounted on the reticle plate 205 is maintained despite the various positions of rotation of the mounting bracket 705 (and the mounting plate 210 coupled thereto) due to the operation of the vacuum lock 610, as described above.

The mounting bracket 705 of the robotic connector 220 couples the end effector 203 to a robot (shown in FIG. 8) used in the lithography process.

The vacuum source 710 provides a vacuuming function to supply vacuum lands 420a–b. The vacuum source 710 is held by the robotic connector 220. The vacuum source 710 has two ends, 710a and 710b. The vacuum source end 710a is coupled to a vacuum pump (not shown) located on the robot (shown in FIG. 8). The vacuum source end 710b extends to an edge on the vacuum plate to supply the vacuum lands 520 on the vacuum plate 205.

The vacuum source 710 is comprised of at least one plastic hose. One skilled in the pertinent art, however, would recognize that the vacuum source 710 can be comprised of any other material known to those skilled in the pertinent art. Further, the vacuum source 710 can be any other medium known to those skilled in the pertinent art.

Figure 8:
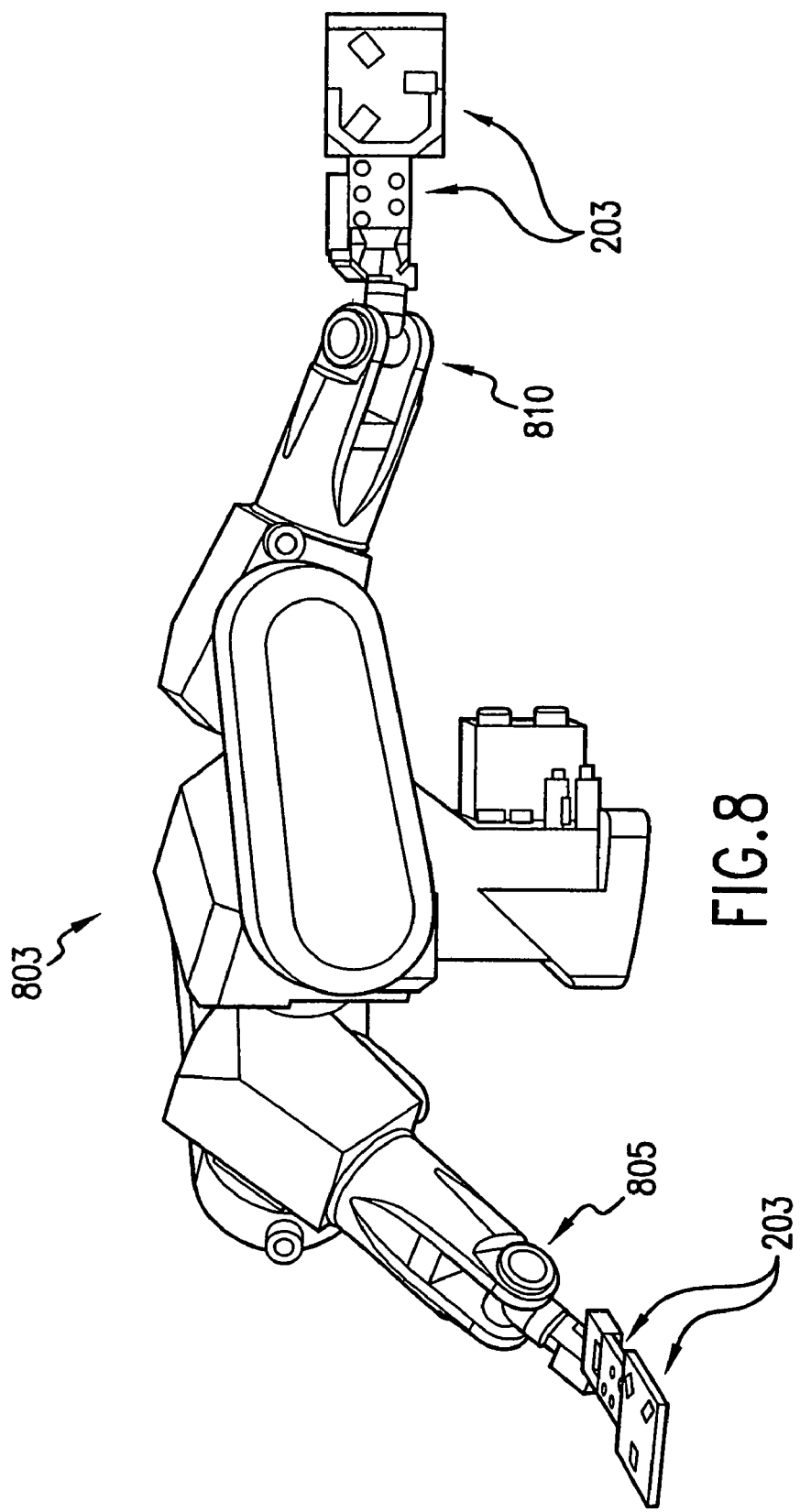
FIG. 8 is an illustration of the various positions of movement of the end effector according to an embodiment of the present invention.

FIG. 8 illustrates the various positions of movement of the end effector according to the present invention. Robot 803 comprises end effector 203. Robot 803 is capable of moving the end effector 203 in various positions including two example positions generally shown at 805 and 810. The generally horizontal position 805 represents the movement of the reticle from the storage facility. The generally vertical position 810 represents reticle alignment at the alignment stage.

CONCLUSION

While various embodiments of the present invention have been described above, it should be understood that they have been presented by way of example, and not limitation. It will be apparent to persons skilled in the pertinent art that various changes in form and detail can be made therein without departing from the spirit and scope of the invention. Thus, the present invention should not be limited by any of the above-described exemplary embodiments, but should be defined only in accordance with the following claims and their equivalents.

What is claimed is:

1. A system, comprising:
   a connection system;
   a reticle plate including connecting areas that receive the connection system;
   a mounting plate that is coupled to the reticle plate via the connection system;
   a robot; and
   a connector that couples the mounting plate to the robot, wherein the connection system rigidly secures the reticle plate to the mounting plate in first through third degrees of freedom and compliantly secures it to the mounting plate in fourth through sixth degrees of freedom.

2. The system of claim 1, wherein the connection system comprises:
   flexures that are position in the connecting areas of the reticle plate;
   a first set of securing devices that secure the flexures to the reticle plate; and
   a second set of securing devices that secure the mounting plate to the reticle plate and the flexures.

3. The system of claim 2, wherein the connection system further comprises:
a locking device on a surface of the mounting plate that interacts with the reticle plate, the locking device releaseably securing the mounting plate to the reticle plate.

4. The system of claim 3, wherein the locking device is a vacuum lock.

5. The system of claim 1, wherein the reticle plate further comprises a reticle securing system to releaseably hold a reticle.

6. The system of claim 5, wherein the reticle securing system comprises a vacuum system.

7. The system of claim 6, wherein the vacuum system comprises lands and seals.

8. The system of claim 1, wherein the first through third degrees of freedom substantially eliminate out-of-plane movement of the reticle plate with respect to the mounting plate.

9. The system of claim 1, wherein the fourth through sixth degrees of freedom allow a predetermined amount of in-plane movement of the reticle plate with respect to the mounting plate.

10. The system of claim 1, wherein the robot holds the reticle plate and mounting plate in a horizontal position during a first state and a vertical position during a second state.

11. A system, comprising:
a reticle plate;
a mounting plate;
a means for connecting the reticle plate to the mounting plate to substantially eliminate out-of-plane movement of the reticle plate with respect to the mounting plate and allow a predetermined amount of in-plane movement of the reticle plate with respect to the mounting plate;
a robot; and
a connector that couples the mounting plate to the robot.

12. The system of claim 11, wherein the means for connecting comprises:
flexures that are position in connecting areas of the reticle plate;
a first set of securing devices that secure the flexures to the reticle plate; and
a second set of securing devices that secure the mounting plate to the reticle plate and the flexures.

13. The system of claim 12, wherein the means for connecting further comprises:
a locking device on a surface of the mounting plate that interacts with the reticle plate, the locking device releaseably securing the mounting plate to the reticle plate.

14. The system of claim 13, wherein the locking device is a vacuum lock.

15. The system of claim 11, wherein the reticle plate further comprises a means for securing a reticle to the reticle plate.

16. The system of claim 15, wherein the means for securing comprises a vacuum system.

17. The system of claim 16, wherein the vacuum system comprises lands and seals.

18. The system of claim 11, wherein the robot holds the reticle plate and mounting plate in a horizontal position during a first state and a vertical position during a second state.

19. A system, comprising:
a connection system;
a reticle plate including connecting areas that receive the connection system;
a mounting plate that is coupled to the reticle plate via the connection system;
a robot; and
a connector that couples the mounting plate to the robot, wherein the connection system substantially eliminates out-of-plane movement of the reticle plate with respect to the mounting plate and allows a predetermined amount of in-plane movement of the reticle plate with respect to the mounting plate.

* * * * *

UNITED STATES PATENT AND TRADEMARK OFFICE
CERTIFICATE OF CORRECTION

| | | |
|---|---|---|
| PATENT NO. | : 7,004,715 B2 | Page 1 of 1 |
| APPLICATION NO. | : 10/040375 | |
| DATED | : February 28, 2006 | |
| INVENTOR(S) | : Friedman et al. | |

It is certified that error appears in the above-identified patent and that said Letters Patent is hereby corrected as shown below:

In column 8, line 62, "position" should be replaced with --positioned--.
In column 10, line 1, "position" should be replaced with --positioned--.

Signed and Sealed this

Twenty-eighth Day of November, 2006

JON W. DUDAS
*Director of the United States Patent and Trademark Office*